United States Patent [19]

Shier

[11] 4,116,732

[45] Sep. 26, 1978

[54] METHOD OF MANUFACTURING A BURIED LOAD DEVICE IN AN INTEGRATED CIRCUIT

[76] Inventor: John S. Shier, 519 N. Castlerock Ter., Sunnyvale, Calif. 94087

[21] Appl. No.: 757,961

[22] Filed: Jan. 10, 1977

Related U.S. Application Data

[62] Division of Ser. No. 724,851, Sep. 20, 1976, Pat. No. 4,064,527.

[51] Int. Cl.$^2$ ............... H01L 21/76; H01L 29/36
[52] U.S. Cl. ................ 148/175; 29/577 C; 29/580; 148/1.5; 148/187; 357/20; 357/50; 357/51; 357/90; 357/52
[58] Field of Search .......... 148/1.5, 175, 187; 357/50, 51, 20, 90, 52; 29/577, 580

[56] References Cited

U.S. PATENT DOCUMENTS

| 3,085,033 | 4/1963 | Handelman | 148/1.5 |
|---|---|---|---|
| 3,203,840 | 8/1965 | Harris | 148/187 |
| 3,386,865 | 6/1968 | Duo | 148/175 |
| 3,418,180 | 12/1968 | Ku | 148/187 |
| 3,489,963 | 1/1970 | Gillett | 357/51 X |
| 3,631,313 | 12/1971 | Moore | 357/51 |
| 3,774,088 | 11/1973 | Magdo et al. | 357/50 |
| 3,873,372 | 3/1975 | Johnson | 148/187 X |
| 3,873,383 | 3/1975 | Kooi | 148/187 |
| 3,891,469 | 6/1975 | Moriyama et al. | 148/187 X |
| 3,928,091 | 12/1975 | Tachi et al. | 148/175 |

OTHER PUBLICATIONS

Deal et al., "Recent Advances... Metal-Oxide-Silicon System", Trans. Metall, Soc. Aime, vol. 233, Mar. 1965, pp. 524-529.

Primary Examiner—L. Dewayne Rutledge
Assistant Examiner—W. G. Saba
Attorney, Agent, or Firm—Alvin E. Hendricson

[57] ABSTRACT

A buried load device in an integrated circuit extends between two regions of like conductivity isolated from each other by thick oxide and substrate comprises a channel beneath the oxide and having dimensions defined by a diffused region of opposite conductivity type. The buried channel is formed by impurity migration from an upper epitaxial layer that is oxidized to separate two regions and the connecting channel width is defined by diffused strip regions of opposite conductivity to establish a desired current-voltage relationship thereof.

4 Claims, 9 Drawing Figures

METHOD OF MANUFACTURING A BURIED LOAD DEVICE IN AN INTEGRATED CIRCUIT

This is a division of application Ser. No. 724,851, filed Sept. 20, 1976, now U.S. Pat. No. 4,064,527.

BACKGROUND OF INVENTION

Integrated circuits employ a variety of different means for interconnecting and isolating various regions thereof. Commonly, PN junctions are employed for isolation although oxide isolation is also employed. Interconnections are commonly formed by metalized contacts for direct connections and by epitaxial and diffused regions for resistive connections. Commonly, resistive connections require additional space and additional processing steps which are disadvantageous in integrated circuits and the manufacture thereof.

The present invention provides a very simply formed buried high resistance connection or load between isolated regions of an integrated circuit.

SUMMARY OF INVENTION

The structure of the present invention provides a buried high resistance connection between otherwise isolated regions of an integrated circuit with such connection or device having a controllable current-voltage characteristic. Adjacent diffused regions of separate devices in an integrated circuit are normally separated by a dividing region, such as substrate, of opposite type conductivity to thus connect the diffused regions by back-to-back diodes or PN junctions for electrical isolation. It is also conventional to deposit an epitaxial layer upon such diffused regions in the formation of bipolar devices therein. Electrical isolation between areas of the epitaxial layer may be provided by selective oxidation of the epitaxial layer to the dividing region or substrate or by a penetrating diffusion of opposite type. The present invention provides one or more channels of the same conductivity as the diffused regions buried below the epitaxial layer and connecting these regions immediately below oxide isolation. The width of a channel is determined by an opening intentionally provided laterally across an elongated separating region of opposite conductivity type from said diffused regions and diffused or implanted into the upper surface of the dividing region or substrate prior to epitaxial growth. The electrical properties of the connecting channel or channels are predeterminable.

The method of the present invention includes the step of diffusing an elongated separating region into a wafer between a pair of regions to be isolated with an opposite conductivity type to said regions and providing openings through such elongated region to define channels of predetermined conductivity between the regions to be isolated. An epitaxial layer is grown over the top of all and this layer is selectively oxidized between the regions to be isolated with such oxidation extending through the epitaxial layer to electrically isolate portions thereof from each other. During selective isolation of the process impurities in the epitaxial layer migrate downward into the volume beneath the layer at the area of oxidation to thus form a channel of the same conductivity type as the regions to be isolated and connecting these regions. The elongated separation region is formed with sufficiently heavy doping or impurity concentration to maintain conductivity type in the presence of migrated impurities from the epitaxial layer. There is thus formed the aforementioned channel with a width established by the width of opening across said elongated isolation channel. The electrical properties of the channel is predeterminable by appropriate choice of parameters including epitaxial layer thickness and impurity concentration, channel width and length and substrate resistivity and crystal orientation, and implantations or diffusions of the same conductivity type as the channel prior to epitaxial growth, and doping steps in the oxide-isolation regions prior to growth of the isolating oxide.

The device of the present invention may be employed in many applications to replace diffused resistors, epitaxial resistors and other types of integrated resistors and in some applications to replace JFETs and MOSFETs as loads and current limiters. The present invention has numerous advantages in addition to ease of manufacture including location under a thick layer of oxide whereby the upper oxide surface may be employed for metal conductors with minimum parasitic capacitance, a constant current characteristic, the connection of buried regions without metal contacts and predeterminable currrent-voltage properties, insensitivity to flaws in subsequent mask layers, ability to provide very small load currents in a very small device area and low capacitance of a load device to other regions.

DESCRIPTION OF FIGURES

The present invention is illustrated as to a preferred embodiment thereof in the accompanying drawing, wherein:

FIG. 5 is a pictorial representation of successive steps in the process or method of the present invention; and FIG. 6 is a graph of current-voltage relationships of a device formed in accordance with the present invention.

DESCRIPTION OF PREFERRED EMBODIMENT

Figure 1:
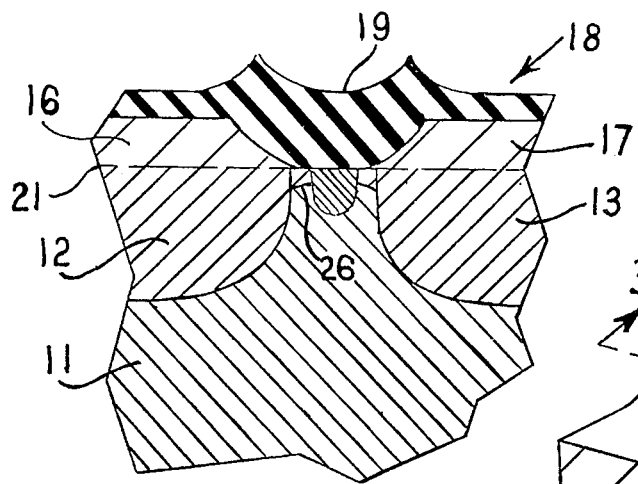
FIG. 1 is a transverse sectional view of a portion of a device formed in accordance with the present invention.

The present invention provides for the formation of a buried load or current limiting connection between isolated regions of an integrated circuit. Referring to FIG. 1 of the drawings, there will be seen to be shown a P-substrate 11 with a pair of spaced apart N+ regions 12 and 13 in the upper surface thereof. These regions 12 and 13 may be employed in the formation of integrated circuit elements such as transistors or the like, which are to be isolated from each other in the integrated circuit. In the formation of many semiconductor devices, it is advantageous to employ a epitaxial layer into which regions are diffused as portions of circuit elements. In FIG. 1 there are illustrated epitaxial layers 16 and 17 atop the regions 12 and 13. These epitaxial regions are lightly doped to form N-epitaxy and one manner of manufacture calls for the provision of a single epitaxial layer over a plurality of separated buried regions such as regions 12 and 13 with subsequent processing being provided to separate the epitaxial layer along the divisions between the buried regions. This separation at FIG. 1 is illustrated to be provided by an oxide layer 18 which is selectively grown to provide a thick oxide layer 19 above the separation between the buried regions 12 and 13 so that this thick oxide layer extends entirely through the epitaxial layer and divides it into the separate epitaxial regions 16 and 17, as illustrated. The thick oxide 19 is grown to the upper surface of the original substrate, which is indicated by the dashed line 21 in FIG. 1, and it is noted that the oxide must extend downwardly at least to the substrate to separate the epitaxial layer.

The structure of the present invention provides a buried "channel" extending between the buried regions 12 and 13 immediately beneath the upper surface 21 of the wafer. This buried channel region 26 comprises a lightly doped N-type region or N− region extending from the buried region 12 to the buried region 13. Provision is also made for interrupting this channel 26 as to provide one or more load devices 27 interconnecting the buried regions 12 and 13.

Figure 2:
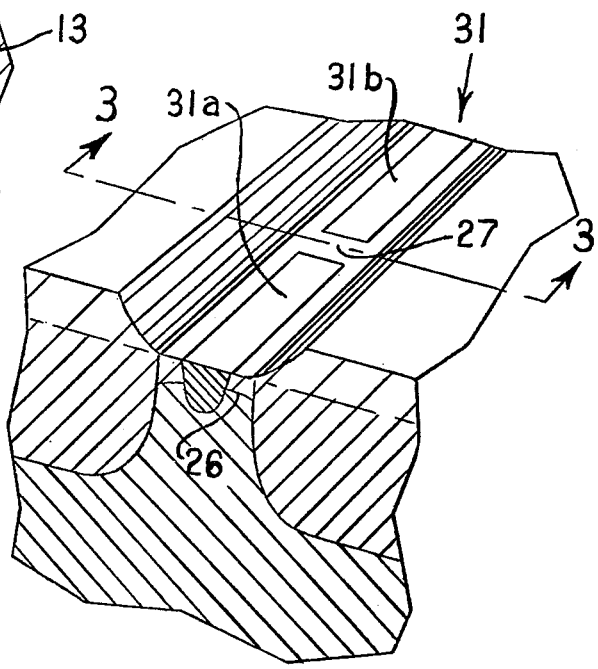
FIG. 2 is a partial cutaway view of the device of FIG. 1 in perspective with the oxide layer removed.
Figure 3:
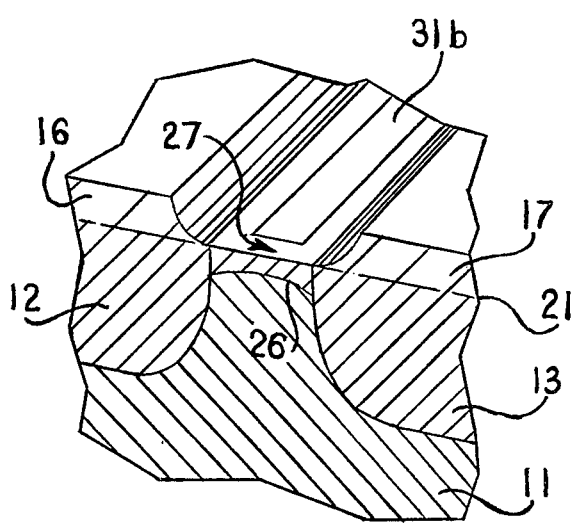
FIG. 3 is a view similar to FIG. 2 but cut away in the plane 3—3 of FIG. 2.
Figure 4:
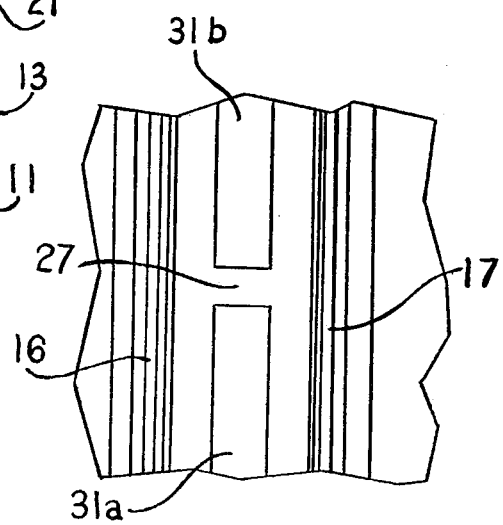
FIG. 4 is a partial plan view of the device of FIG. 1 with the oxide layer removed.
Figure 1:
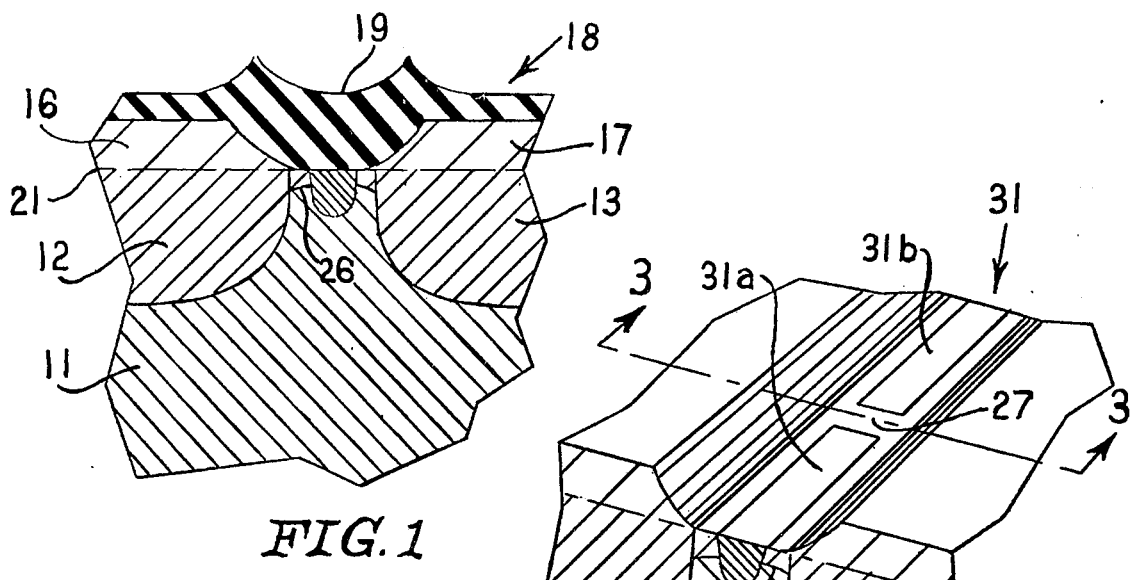
Figure 2:
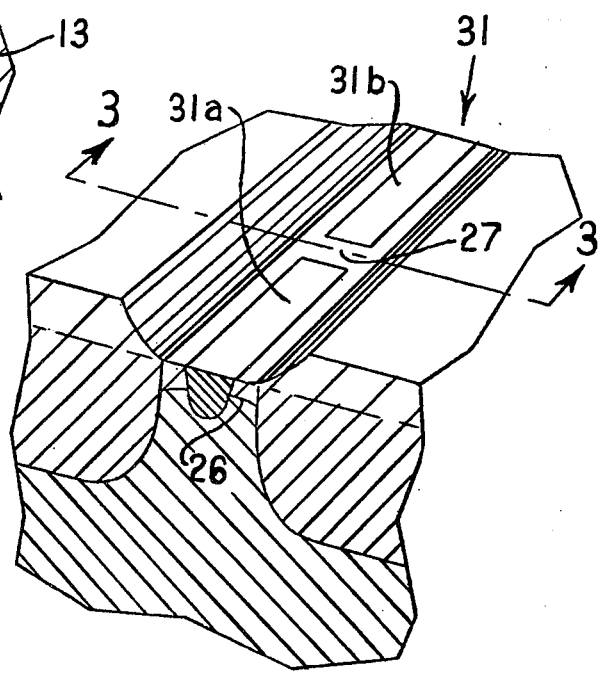
Figure 3:
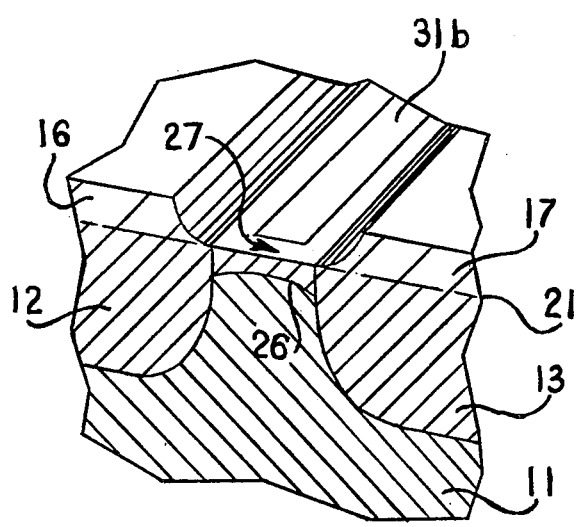
Figure 4:
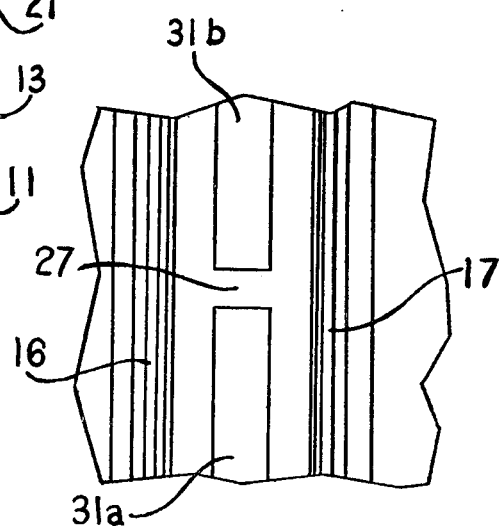

Referring now to FIGS. 2, 3 and 4 wherein the present invention is illustrated with the oxide layer removed, there will be seen to be provided elongated buried P+ regions 31a, 31b, etc., disposed between the N+ regions 12 and 13 at the surface 21 of the wafer. These elongated separating regions 31a and 31b may be formed by diffusion or implantation of acceptor impurities into the substrate prior to the deposition of the epitaxial layer or layers by conventional masking and etching procedures. The regions 31a and 31b have a predetermined separation whereat the load device or channel 27 extends between the buried regions 12 and 13. Considered alternatively, there is provided a diffused or buried region 31 extending about one or both of the diffused buried regions 12 and 13 with at least one lateral opening through the region 31 for extension of the channel 27 therethrough between the regions 12 and 13. The lateral dimensions of the channel 27 will be seen to be precisely determinable by the width of the opening through the separation region 31 extending between the regions 12 and 13. By appropriate variations in the parameters of the channel 27 it is possible to establish desired characteristics of the channel such as a constant current behavior at voltages above some predetermined minimum.

Considering now the process or method of manufacture of the present invention and referring to FIGS. 5A through 5D, it will be seen in FIG. 5A that two or more N+ regions 12 and 13 are extended into the supper surface 21 of a P− substrate or wafer as by conventional diffusion techniques to establish a desired concentration of donor impurities in the regions 12 and 13. The regions 12 and 13 are provided in an integrated circuit during the course of manufacture thereof and one or more transistor devices may be formed in each of the regions. In accordance with the present invention, there is next formed an elongated P+ region 31 in the substrate 11 between the regions 12 and 13, as illustrated in FIG. 5B. This P+ region 31 may be conventionally formed by implanting or by diffusion processing through an opening etched in an oxide mask 32 atop the wafer and particularly covering the PN junctions between the substrate and N+ regions 12 and 13. The oxide layer 32 is then removed as by acid etching and an N-epitaxial layer 15 is grown from the vapor phase upon the upper surface 21 of the wafer, as shown in FIG. 5C.

In conventional integrated circuit manufacture, a P-type base region may be diffused into the epitaxial layer 15 atop an N+ buried region 12, for example, and one or more N-type emitter regions diffused into such a base region to form an integrated circuit transistor with a protective oxide layer thereover. In order to isolate such transistors above regions 12 and 13, for example, it is necessary to interrupt or divide the epitaxial layer 15, and this may be accomplished by selectively oxidizing the N-epitaxial layer 15 between the buried regions 12 and 13. Selective oxidation of silicon of various types, including epitaxially grown silicon, is known in the art and is commonly accomplished with a silicon nitride mask. Conventional practice provides for the application of a uniform silicon nitride layer which is then patterned with a mask to form openings therethrough. The wafer is then oxidized and a thick oxide grown in the nitride openings. The nitride is then removed to leave the thick oxide as shown in FIG. 5D. The oxide must extend at least into contact with the upper surface of the separation region 31 and may extend laterally thereof as shown in FIG. 5D. The thick oxide 19 is shown to extend to the upper surface 21 of the wafer and to contact both buried regions 12 and 13, the substrate 11 and the separation region 31. During selective oxidation of the epitaxial layer 15 to form the oxide isolation as shown at 19, it has been found that the donor impurities in the epitaxy migrate downwardly into the substrate between the buried regions 12 and 13. Inasmuch as the substrate 11 has a low acceptor impurity concentration, these migrating donor impurities change the conductivity type of the upper portion of substrate to form an N− region 26 which may have somewhat of an under surface as indicated by the dashed line in FIG. 5D, except for the present of the P+ separation region 31. This P+ region 31 acts as a "channel stopper" in that the concentration of donor impurities therein is insufficient to overcome the P+ conductivity so that the N− channel region 26 is interrupted by the region 31 between the buried regions 12 and 13.

The present invention furthermore provides for the predetermined separation of the P+ region 31 into at least two longitudinal segments as illustrated, for example, in FIGS. 2 and 4. The P+ region 31 may be formed, as noted above, by conventional diffusion techniques wherein an oxide layer is etched to form openings through which acceptor impurities are diffused into the substrate. By appropriate etching of the oxide layer 32 of FIG. 5B as, for example, through a conventional photoresist mask, diffusion of the acceptor impurity is limited to provide a lateral opening through the region 31. In this area of the substrate no additional acceptor impurities are diffused so that the migrating donor impurities from the epitaxial layer 15 are able to change the conductivity type of the substrate and thus form an uninterrupted N− channel 27 extending between the buried regions 12 and 13 within the wafer. The present invention thus very simply provides for the formation of buried N-channels between otherwise buried isolation regions in an integrated circuit. Conventional masking and diffusion techniques provide for very precise control over the dimensions and configurations of the P+ separation region or regions 31 so that the width of the buried channel 27 may be precisely controlled.

It will be appreciated that the present invention may be formed with a variety of different dimensions and configurations and one device formed in accordance with the present invention had a width of the channel 27, as defined by the mask employed to diffuse separation regions 31a and 31b, of 0.00025 inches with a length about 3 times the width. In the metric system, more normally employed for such small measurements, it is noted that the channel width was about 6 microns and the channel length about 18 microns. The foregoing device exhibited a current-voltage relationship as shown at curve A of FIG. 6.

The shape of this curve may be controllably varied and a device having a substantial linearity and constant current behavior at voltages above some minimum, as shown in curve B of FIG. 6, may be provided by reducing the impurity level in the channel as by lowering the doping level of the epitaxial layer, for example.

The present invention has been described above with respect to a particular preferred embodiment and steps of the process; however, it will be apparent to those skilled in the art that numerous modifications and variations are possible within the spirit and scope of the invention and thus it is not intended to limit the invention by the precise terms of description or details of illustration.

What is claimed is:

1. A process of forming an integrated circuit comprising the steps of
    forming an elongated heavily doped region of first conductivity type in the upper surface of a lightly doped substrate of first conductivity type between at least first and second regions of second conductivity type disposed in the upper surface of said substrate, with at least one lateral opening of predetermined width through said elongated region,
    depositing a lightly doped epitaxial layer of second conductivity type on the upper surface of said substrate over said regions, and
    selectively oxidizing said epitaxial layer between said regions of second conductivity type to extend oxide at least into contact with said elongated region, said oxidation causing impurities to migrate from said epitaxial layer into the substrate surface, said impurities being sufficient to convert the substrate region defined by said lateral opening to the second conductivity type, and thus form a channel of lightly doped second conductivity type through the lateral opening in said elongated region between said first and second regions.

2. The process of claim 1 further defined by the steps of
    diffusing said elongated region by means of masking for precisely establishing the dimensions of said lateral opening therethrough to thereby establish a parameter of said channel connecting said first and second regions.

3. The process of claim 1 further defined by the step of providing an electrical contact to said substrate for the application of a control voltage thereto that controls conduction through said channel between said first and second regions.

4. The process of claim 1 further defined by
    diffusing said first and second regions as N+ regions in a P− substrate,
    diffusing said elongated region as a P+ region in said P− substrate, and
    forming said epitaxial layer as an N− layer, whereby impurities from said N− epitaxial layer that migrate downward are insufficient to change the conductivity type of said elongated layer but are sufficient to form an N− channel in said P− substrate that extends only through the lateral opening in said P+ elongated layer between said first and second N+ regions.

* * * * *